United States Patent
Chen et al.

(10) Patent No.: US 12,501,626 B2
(45) Date of Patent: Dec. 16, 2025

(54) MAGNETIC DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Jui-Lin Chen, Taipei (TW); Hsin-Wen Su, Hsinchu (TW); Shih-Hao Lin, Hsinchu (TW); Po-Sheng Lu, Hsinchu (TW); Chenchen Jacob Wang, Hsinchu (TW); Yuan Hao Chang, Hsinchu (TW); Ping-Wei Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/731,494

(22) Filed: Jun. 3, 2024

(65) Prior Publication Data
US 2024/0324245 A1   Sep. 26, 2024

Related U.S. Application Data

(63) Continuation of application No. 17/408,145, filed on Aug. 20, 2021, now Pat. No. 12,022,664.

(60) Provisional application No. 63/173,149, filed on Apr. 9, 2021.

(51) Int. Cl.
  *H10B 61/00*   (2023.01)
  *H10N 50/80*   (2023.01)

(52) U.S. Cl.
  CPC ............ *H10B 61/22* (2023.02); *H10N 50/80* (2023.02)

(58) Field of Classification Search
  CPC ...... H05K 9/0075; H10B 61/22; H10B 61/20; H10N 50/80; H10N 50/10
  See application file for complete search history.

(56) References Cited

U.S. PATENT DOCUMENTS

| | | | |
|---|---|---|---|
| 2008/0122047 A1* | 5/2008 | Honer | H01L 23/552 257/659 |
| 2012/0126382 A1* | 5/2012 | Katti | H01L 23/13 438/109 |
| 2014/0225208 A1 | 8/2014 | Gu et al. | |
| 2015/0069545 A1 | 3/2015 | Noma | |
| 2015/0084141 A1* | 3/2015 | Fujimori | H10B 61/00 257/421 |
| 2020/0006245 A1* | 1/2020 | Chuang | H01L 23/49555 |

* cited by examiner

*Primary Examiner* — Shih Tsun A Chou
(74) *Attorney, Agent, or Firm* — NZ Carr Law Office

(57) ABSTRACT

A magnetic device structure is provided. In some embodiments, the structure includes one or more first transistors, a magnetic device disposed over the one or more first transistors, a plurality of magnetic columns surrounding sides of the one or more first transistors and the magnetic device, a first magnetic layer disposed over the magnetic device and in contact with the plurality of magnetic columns, and a second magnetic layer disposed below the one or more first transistors and in contact with the plurality of magnetic columns.

20 Claims, 13 Drawing Sheets

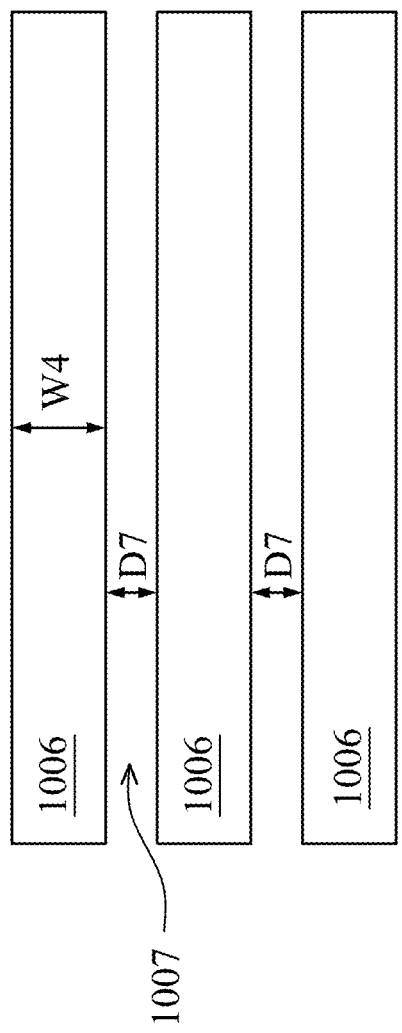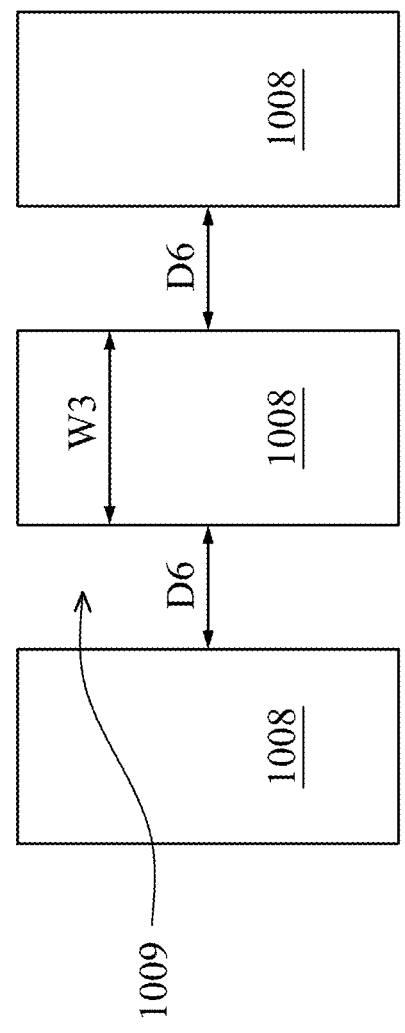

MAGNETIC DEVICE STRUCTURE AND METHODS OF FORMING THE SAME

CROSS-REFERENCE TO RELATED APPLICATIONS

This application is a continuation application of U.S. patent application Ser. No. 17/408,145 filed Aug. 20, 2021, which claims a priority to a U.S. provisional application Ser. No. 63/173,149 filed on Apr. 9, 2021, both are incorporated by reference in its entirety.

BACKGROUND

Magnetic devices are widely used semiconductor devices for electronic applications, including radios, televisions, cell phones, and personal computing devices. One type of well-known magnetic devices is a semiconductor storage device, such as magnetic random access memories (MRAMs).

Some of the recent development in magnetic devices such as MRAMs involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device.

The states of the magnetic devices may be controlled by applying magnetic fields created by electric current. However, the magnetic devices are easily interfered by external magnetic field, which may lead to anomalous memory storage, aberrant device operations, malfunctioning, or damages. Therefore, an improved magnetic device structure is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-10F are cross-sectional top views of the magnetic device structure, in accordance with alternative embodiments.

DETAILED DESCRIPTION

Figure 1:
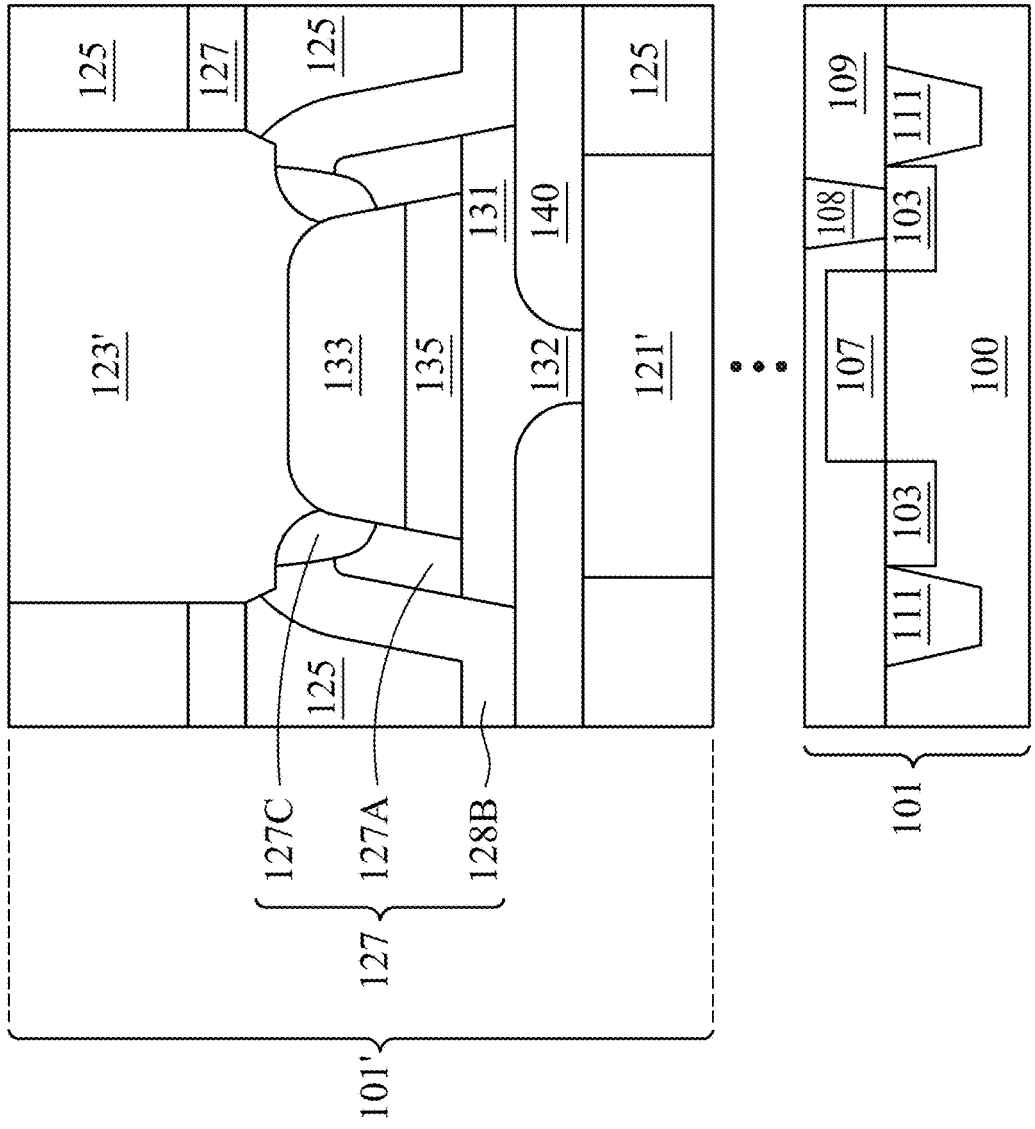
FIGS. 1-5 are cross-sectional side views of a magnetic device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embedded MRAM cells in a CMOS structure has been continuously developed. In the MRAM cells region on a substrate, transistors can be disposed under the MRAM cells. In some embodiments, the MRAM cells are embedded in the interconnect structure formed in a back-end-of-line (BEOL) operation. For example, the transistors in the MRAM cells region are disposed over a common semiconductor substrate and prepared in a front-end-of-line (FEOL) operation. The MRAM cells may be embedded at any location in the interconnect structure, for example, between adjacent metal line layers distributed horizontally parallel to a surface of the semiconductor substrate. For instance, the embedded MRAM cells may be located between the 4th metal line layer and the 5th metal line layer of the interconnect structure in the MRAM cells region. The number provided for the metal line layers herein is not limiting. In general, person having ordinary skill in the art can understand that the MRAM cells are located between an $N^{th}$ metal line layer and an $(N+1)^{th}$ metal line layer, where N is an integer greater than or equal to 1.

FIGS. 1-6 are cross-sectional side views of a magnetic device structure 10, in accordance with some embodiments. As shown in FIG. 1, the magnetic device structure 10 includes a transistor structure 101 and an interconnect structure 101'. In some embodiments, the transistor structure 101 is formed over a semiconductor substrate 100. The semiconductor substrate 100 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the semiconductor substrate 100 is made of silicon. In some embodiments, the semiconductor substrate 100 is a silicon-on-insulator (SOI) substrate having an insulating layer (not shown) disposed between two silicon layers for enhancement. In one aspect, the insulating layer is an oxygen-containing layer.

Epitaxial features such as sources 103 and drains 105 are disposed in the semiconductor substrate 100, as shown in FIG. 1. A gate electrode layer 107 is positioned over the semiconductor substrate 100 and between the source 103 and the drain 105. Conductive contacts 108 are formed in an inter-layer dielectric (ILD) 109 and may be electrically coupled to the source 103 and/or drain 105. In some embodiments, the ILD 109 is formed over the semiconductor substrate 100, and a contact etch stop layer (CESL) (not shown) may be formed between the semiconductor substrate 100 and the ILD 109. The ILD 109 may be formed by any suitable process, such as chemical vapor deposition (CVD), low-pressure CVD (LPCVD), plasma-enhanced CVD (PECVD), physical vapor deposition (PVD), thermal growing, or the like. The ILD 109 may include any suitable dielectric material, such as an oxide (e.g., Ge oxide), an oxynitride (e.g., GaP oxynitride), silicon dioxide ($SiO_2$), a nitrogen-containing oxide (e.g., nitrogen-containing $SiO_2$), a nitrogen-doped oxide (e.g., $N_2$-implanted $SiO_2$), silicon oxynitride ($Si_xO_yN_2$), or the like.

FIG. 1 shows a planar transistor formed in the semiconductor substrate 100. However, the present disclosure is not limited thereto. Any non-planar transistors, such as FinFETs, nanostructure transistors, or any suitable transistors, may be part of the transistor structure 101. Nanostructure transistors may include horizontal gate all around (HGAA) FETs and vertical gate all around (VGAA) FETs.

In some embodiments, a shallow trench isolation (STI) 111 is provided to define and electrically isolate adjacent transistors. The STI 111, which may be formed of suitable dielectric materials, may be provided to isolate a transistor electrically from neighboring semiconductor devices such as other transistors. The STI 111 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon oxide); or any suitable dielectric material. The STI 111 may be formed by any suitable method, such as low-pressure chemical vapor deposition (LPCVD), plasma enhanced CVD (PECVD) or flowable CVD (FCVD).

As shown in FIG. 1, the interconnect structure 101' is disposed above the transistor structure 101. Because the $N^{th}$ metal line layer 121' may not be the first metal line layer over the transistor structure 101, the omission of a portion of the interconnect structure 101' is represented by dots. An MRAM structure (131, 132, 133, 135) is disposed between an $N^{th}$ metal line layer 121' and an $(N+1)^{th}$ metal line layer 123'. The interconnect structure 101' includes a plurality of metal line layers. Throughout the description, the term "metal line layer" refers to the collection of the conductive features disposed in the same layer. For example, the metal line layers are formed in inter-metal dielectrics (IMDs) 125, which may be formed of oxides such as un-doped silicate glass (USG), fluorinated silicate glass (FSG), low-K dielectric materials, or the like. In some embodiments, the K value of the low-K dielectric material is less than about 3.0, such as less than about 2.5. The metal line layers 121', 123' may include an electrically conductive material, such as copper, and may be formed by any suitable process, such as electroplating, electroless plating, high-density ionized metal plasma (IMP) deposition, high-density inductively coupled plasma (ICP) deposition, PVD, CVD, LPCVD, PECVD, or the like.

As shown in FIG. 1, the MRAM structure at least includes a bottom electrode via (BEVA) 132, a bottom electrode 131, a top electrode 133, and a MTJ 135. The BEVA 132 is disposed on the $N^{th}$ metal line layer 121'. In some embodiments, the BEVA 132 is surrounded by a dielectric stack 140 including SiC and silicon rich oxide (SRO). Alternatively, the SRO can be replaced or combined with an oxide formed from tetraethyl orthosilicate (TEOS). In some embodiments, the BEVA 132 may include an electrically conductive material such as a metal. The bottom electrode 131 may include an electrically conductive material, such as TiN, TaN, W, Al, Ni, Co, Cu, or combinations thereof. In some embodiments, the material of the bottom electrode 131 is different from that of the BEVA 132.

As shown in FIG. 1, the MTJ 135 is disposed on the bottom electrode 131. The MTJ may be a STT-MTJ, and the MRAM cell may be a STT-MRAM. A sidewall of the MTJ 135 is protected by a dielectric layer 127 such as a nitride layer. The top electrode 133 is disposed on the MTJ 135. In some embodiments, the top electrode 133 may include an electrically conductive material, such as TiN, TaN, Ta or Ru. In some embodiments, the top electrode 133 and the bottom electrode 131 are made of a same material. In some embodiments, the material of the top electrode 133 is different from that of the BEVA 132 and the bottom electrode 131.

As shown in FIG. 1, the $(N+1)^{th}$ metal line layer 123' is surrounded by a dielectric layer 127 in addition to the IMDs 125. In some embodiments, the dielectric layer 127 includes silicon nitrides. In some embodiments, the dielectric layer 127 includes an SRO layer and an SiC layer. As shown in FIG. 1, the dielectric layer 127 is a dielectric structure including a first dielectric layer 127A, a second dielectric layer 127B, and a third dielectric layer 127C. Each of the first, the second, and the third dielectric layers 127A, 127B, 127C may include silicon nitride. Since the first, the second, and the third dielectric layers 127A, 127B, 127C are formed at different deposition operations, interfaces between the dielectric layers can be observed.

In some embodiments, the BEVA 132 of the MRAM structure is electrically coupled to the drain 105 or the source 103. In some embodiments, the BEVA 132 of the MRAM structure is electrically coupled to the gate electrode layer 107.

Figure 2:
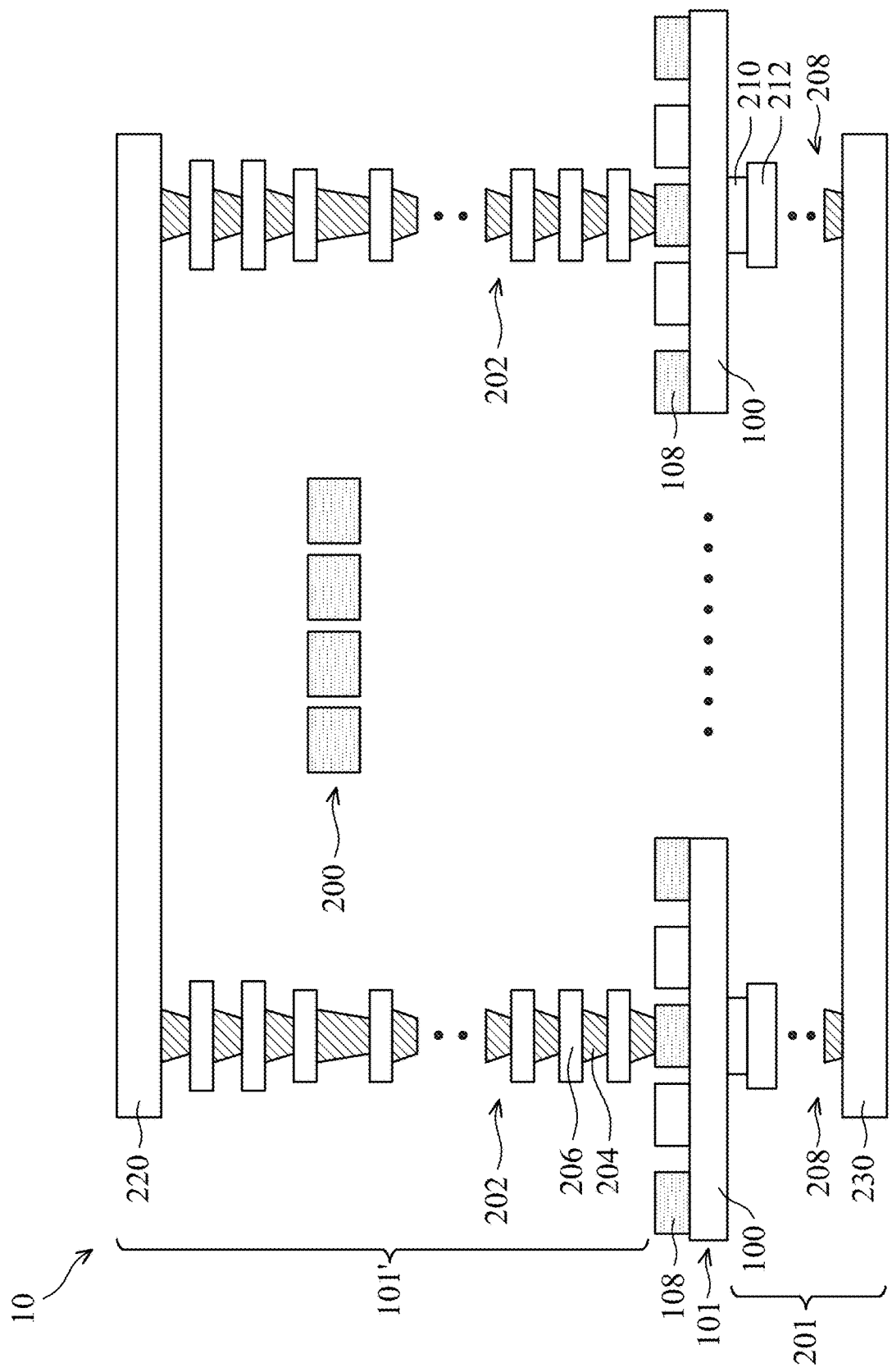

FIG. 2 is a cross-sectional side view of the magnetic device structure 10, in accordance with some embodiments. As shown in FIG. 2, the magnetic device structure 10 includes a MRAM array 200 embedded in the interconnect structure 101' disposed over the transistor structure 101. The MRAM array 200 includes one or more MRAM structure shown in FIG. 1. In some embodiments the MRAM array 200 includes 64 MRAM structures, or cells. The IMDs 125 and other dielectric layers (FIG. 1) are omitted for clarity.

As shown in FIG. 2, a plurality of conductive contacts 108 are disposed over the substrate 100. The transistors, such as the source 103, the drain 105, and the gate electrode layer 107 are omitted for clarity. The conductive contacts 108 may be electrically connected to corresponding sources 103, drains 105, and gate electrode layers 107. In some embodiments, a plurality of magnetic structures 202 is in contact with corresponding conductive contacts 108, which are in contact with dummy transistors. The dummy transistors are not electrically connected to a voltage source, and no electric current flows through the dummy transistors. The plurality of magnetic structures 202 may be connected to the conductive contacts 108 disposed on front sides of the dummy transistors. A plurality of magnetic structures 208 may be connected to back sides of the dummy transistors. As shown in FIG. 2, the omission of portions of the magnetic structures 202, 208 are represented by dots. The magnetic structures 202, 208 may be disposed in the IMDs 125, which are omitted for clarity. As shown in FIG. 2, the omission of a portion of the transistor structure 101 including a plurality of transistors is represented by dots. The metal line layers disposed in the IMDs, such as the metal line layers 121', 123' disposed in the IMDs, are also omitted for clarity. The MRAM array 200 is electrically connected to the omitted transistors via the omitted metal line layers. For example, referring back to FIG. 1, the MRAM array 200 includes MRAM cells each having the BEVA 132, the bottom electrode 131, the top electrode 133, and the MTJ 135, and each MRAM cell is electrically connected to a corresponding conductive contact 108, which is electrically connected to a corresponding source 103, drain 105, or gate electrode layer 107.

As shown in FIG. 2, each magnetic structure 202 includes magnetic features 204, 206. In some embodiments, each magnetic structure 202 includes a plurality of magnetic features 204 and a plurality of magnetic features 206 alternately arranged. The magnetic features 204 may be magnetic vias, and the magnetic features 206 may be magnetic islands. Islands may have smaller dimensions than lines. In some embodiments, the magnetic feature 206 may have a substantially square shape in a plane substantially parallel to a major surface of the substrate 100. For example, the magnetic feature 206 may have dimensions slightly greater than a diameter of the magnetic feature 204 in the plane substantially parallel to the major surface of the substrate 100. The magnetic features 204, 206 may include a magnetic material, such as Co, Fe, Ni, or combinations thereof. In some embodiments, the magnetic features 204, 206 includes Co or NiFe. The conductive contacts 108 in contact with the magnetic structures 202 may also include a magnetic material. In some embodiments, the conductive contacts 108 in contact with the magnetic structures 202 include the same magnetic material as the magnetic structures 202. The MRAM array 200 is surrounded on all four sides by the magnetic structures 202.

The interconnect structure 101' further includes a magnetic layer 220 disposed over the MRAM array 200. The magnetic layer 220 may include the same magnetic material as the magnetic structure 202. The magnetic layer 220 and the magnetic structures 202 function as a magnetic shield for the MRAM array 200, and magnetic material of the magnetic layer 220 and the magnetic structures 202 blocks any applied external perpendicular magnetic field from the top and sides of the MRAM array 200. In other words, the magnetic layer 220 and the magnetic structures 202 improves the magnetic immunity of the MRAM array 200 against the applied external perpendicular magnetic field from the top and sides of the MRAM array 200. In order to function as a magnetic shield, the magnetic layer 220 and the magnetic structures 202 are not electrically connected to a voltage source, and no electric current flows through the magnetic layer 220 and the magnetic structures 202. As a result, device life of the magnetic device, such as the MRAM array 200, is extended, and device failure is minimized.

The transistor structure 101 may further include back side contacts (not shown) in contact with the dummy transistors that are in contact with the magnetic structures 202. The back side contacts may include the same magnetic material as the magnetic structures 202. The back side contacts are in contact with the plurality of magnetic structures 208. Similar to the magnetic structures 202, each magnetic structure 208 includes magnetic features 210, 212. In some embodiments, each magnetic structure 208 includes a plurality of magnetic features 210 and a plurality of magnetic features 212 alternately arranged. The magnetic features 210 may be magnetic vias, and the magnetic features 212 may be magnetic islands. The magnetic features 210, 212 may include the same magnetic material as the magnetic structure 202. The conductive contacts (not shown) in contact with the magnetic structures 208 may also include the same magnetic material as the magnetic structures 202. The magnetic structures 208 may be disposed in a back side interconnect structure 201. The back side interconnect structure 201 may include the IMDs 125 (not shown) and may or may not include the metal line layers 121', 123' (not shown). The magnetic structures 208 may be disposed in the IMDs 125 (not shown).

The back side interconnect structure 201 further includes a magnetic layer 230 disposed below the MRAM array 200 and below the transistor structure 101. The magnetic layer 230 may include the same magnetic material as the magnetic structure 202. The magnetic layer 230 functions as a bottom magnetic shield for the MRAM array 200, and magnetic material of the magnetic layer 230 and the magnetic structures 208 blocks any applied external perpendicular magnetic field from the bottom of the MRAM array 200. Thus, the magnetic layer 220, the plurality of magnetic structures 202, the plurality of magnetic structures 208, and the magnetic layer 230 together form a shield that blocks any external magnetic field from reaching the MRAM array 200 from the top, the sides and the bottom. As described above, in order to function as a magnetic shield, the magnetic layer 230 and the magnetic structures 208 are not electrically connected to a voltage source, and no electric current flows through the magnetic layer 230 and the magnetic structures 208. Thus, the magnetic layer 220, the plurality of magnetic structures 202, the plurality of magnetic structures 208, and the magnetic layer 230 are not electrically connected to a voltage source, and no electric current flows through the magnetic layer 220, the plurality of magnetic structures 202, the plurality of magnetic structures 208, and the magnetic layer 230. As a result, device life of the magnetic device, such as the MRAM array 200, is extended, and device failure is minimized.

Figure 3:
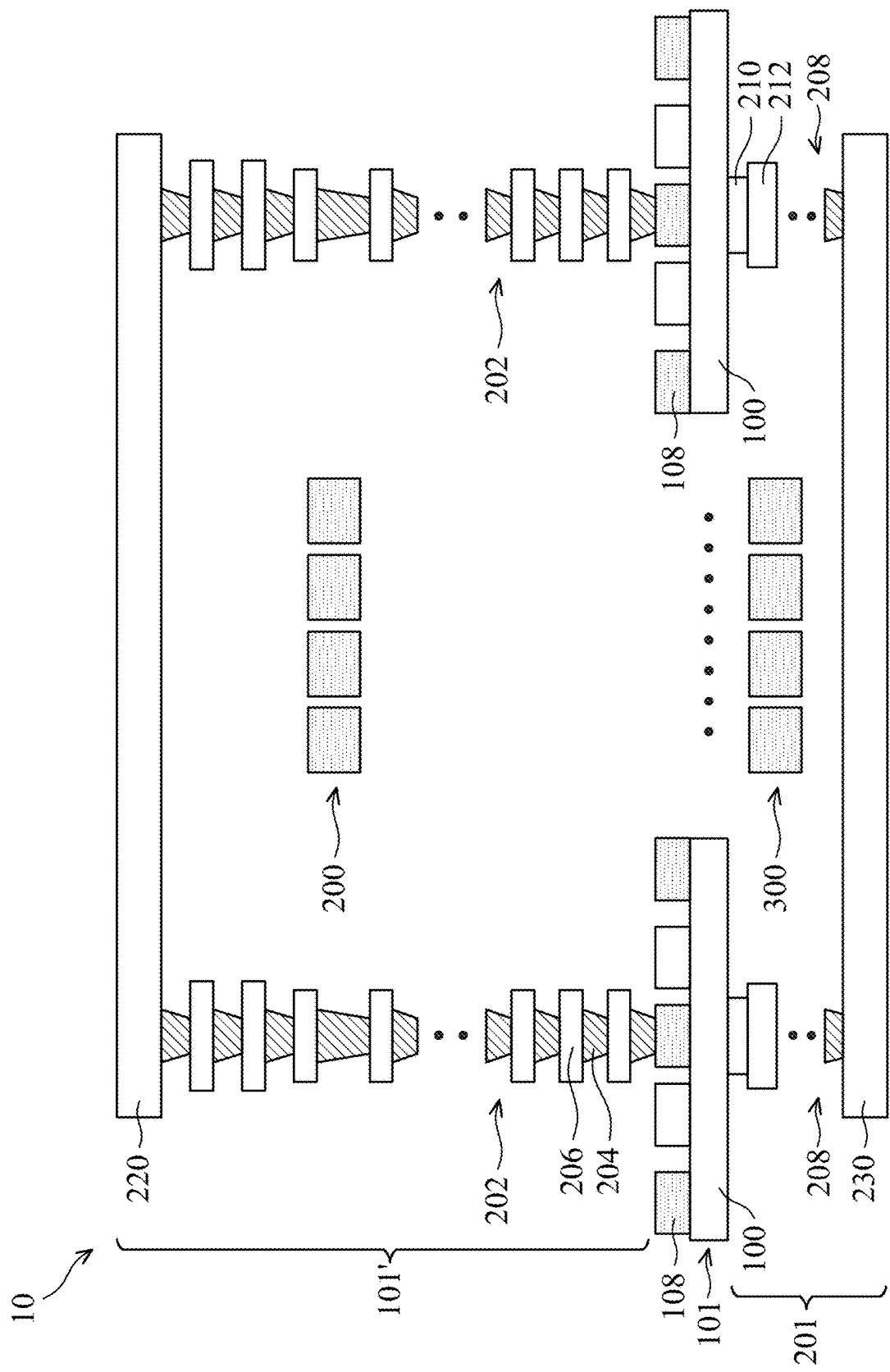

In some embodiments, the number of the plurality of magnetic features 210, 212 is less than the number of the plurality of magnetic features 204, 206. In other words, the length of each magnetic structure 208 is substantially smaller than the length of each magnetic structure 202. In such embodiments, the metal line layers, such as metal line layers 121', 123' shown in FIG. 1 are not disposed in the IMDs 125 in the back side interconnect structure 201. In some embodiments, the length of each magnetic structure 208 is substantially the same or greater than the length of each magnetic structure 202. In such embodiments, a MRAM array 300 may be disposed between the transistor structure 101 and the magnetic layer 230, as shown in FIG. 3. The MRAM array 300 may include the same or different number of MRAM cells as the MRAM array 200. As shown in FIG. 3, both MRAM arrays 200, 300 are shielded by the magnetic layer 220, the plurality of magnetic structures 202, the plurality of magnetic structures 208, and the magnetic layer 230 against any external magnetic field. The MRAM array 300 may be electrically connected to the transistors in the transistor structure 101 by the metal line layers, such as the metal line layers 121', 123' shown in FIG. 1, which are electrically connected to back side contacts (not shown). The MRAM arrays 200, 300, the transistors electrically connected to the MRAM arrays 200, 300, and the metal line layers electrically connected to the transistors and the MRAM arrays 200, 300 are electrically connected to one or more voltage sources and have electric currents flowing therethrough.

Figure 4:
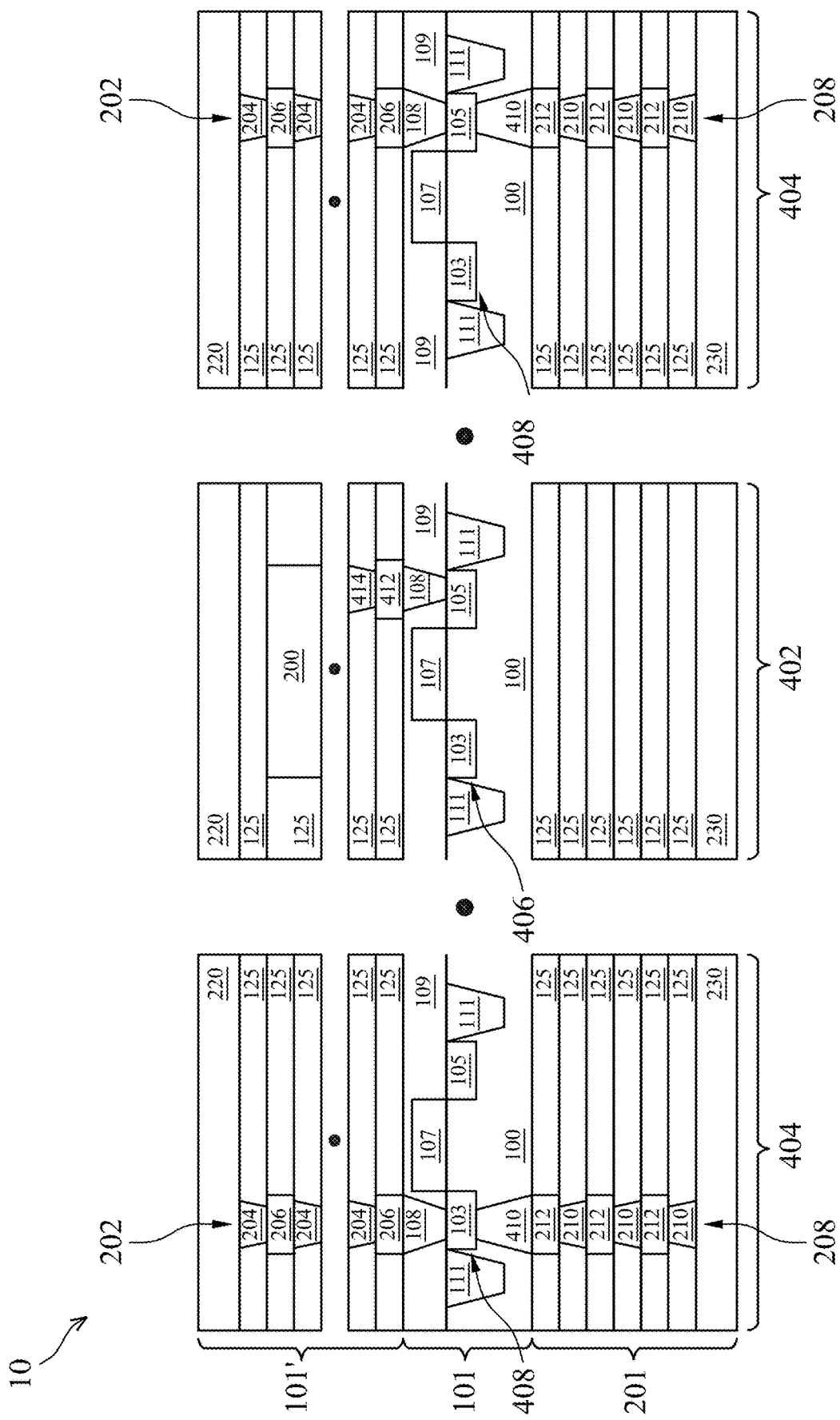

FIG. 4 is a cross-sectional side view of the magnetic device structure 10, in accordance with some embodiments. As shown in FIG. 4, the transistor structure 101 is disposed between the interconnect structure 101' and the back side interconnect structure 201. The interconnect structure 101' may be first formed over the transistor structure 101. The resulting structure may be flipped over, so the back side of the substrate 100 is at the top of the structure. The back side interconnect structure 201 is then formed over the back side of the substrate 100. As shown in FIG. 4, the magnetic device structure 10 includes an active device region 402 surrounded by magnetic shield regions 404. The active device region 402 includes the portion of the transistor structure having one or more transistors 406, and each transistor 406 includes at least the source 103, the drain 105, and the gate electrode layer 107. The conductive contact 108 in electrical contact with the transistor 406 is electrically connected to the MRAM array 200 by conductive features 412, 414. In some embodiments, the conductive features 412 is a conductive line, and the conductive feature 414 is a conductive via. The conductive features 412, 414 may include the same material as the metal line layers 121'.

In some embodiments, during the formation of the interconnect structure 101', each IMD 125 may be deposited and patterned to form a plurality of openings in the active device region 402 and the magnetic shield regions 404. A first material is formed in the openings in the active device region 402 and the magnetic shield regions 404. A mask is formed on the first material in the active device region 402 or the magnetic shield regions 404. The exposed first material in the active device region 402 or the magnetic shield regions 404 may be removed and replaced with a second material. In some embodiments, the first material is copper, the mask is formed on the first material in the active device region 402, and the exposed first material in the openings in the magnetic shield regions 404 is replaced with a magnetic material, such as Co, Ni, Fe, or combinations thereof. In some embodiments, the first material is a magnetic material, such as Co, Ni, Fe, or combinations thereof, the mask is formed on the first material in the magnetic shield regions 404, and the exposed first material in the openings in the active device region 402 is replaced with copper. As a result, conductive feature 412 (or conductive feature 414) and magnetic feature 206 (or magnetic feature 204), which include different materials, are formed in the same IMD 125. As described above, the transistors 406, the MRAM array 200, and the conductive features 412, 414 in the active device region 402 are electrically connected to a voltage source. The magnetic shield regions 404 include the portions of the transistor structure 101 having dummy transistors 408. The dummy transistors 408, the conductive contacts 108 in contact with the dummy transistors 408, and the magnetic structures 202 are not electrically connected to a voltage source. The magnetic layer 220 is disposed on the magnetic structures 202 and over the MRAM array 200. The magnetic layer 220 is disposed in the active device region 402 and the magnetic shield regions 404. However, the portion of the magnetic layer 220 disposed in the active device region 402 is not electrically connected to a voltage source.

As shown in FIG. 4, back side contacts 410 are formed in the substrate 100 and are in contact with the dummy transistors 408. The dummy transistors 408 may be formed along with the transistors 406 in the active device region 402 and may include the sources 103, the drains 105, and the gate electrode layers 107. The back side contacts 410 may be in contact with the sources 103, as shown in FIG. 4. The back side contacts 410 may be in contact with any portions of the dummy transistors 408 that are in contact with the magnetic structures 202. The back side interconnect structure 201 include the IMDs 125 and the magnetic features 210, 212 disposed therein. In some embodiments, as shown in FIG. 4, the IMDs 125 in the back side interconnect structure 201 extends across the active device region 402, and no metal line layers are disposed in the portion of the IMDs 125 in the active device region 402. The magnetic layer 230 is disposed under the IMDs 125 and in contact with the magnetic structures 208. As described above, the dummy transistors 408, the back side contacts 410 in contact with the dummy transistors 408, the magnetic structures 208, and the magnetic layer 230 are not electrically connected to a voltage source.

Figure 5:
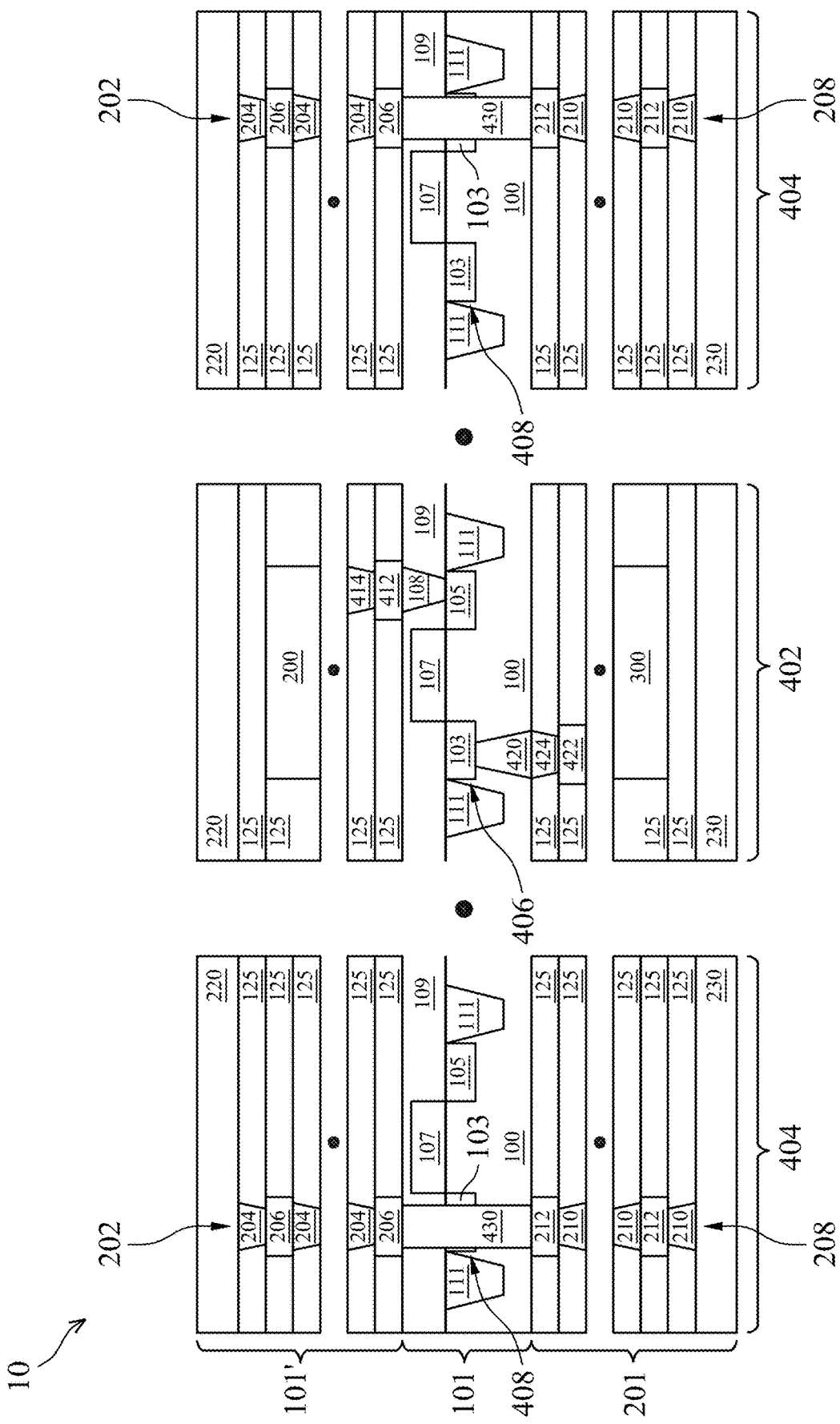

FIG. 5 is a cross-sectional side view of the magnetic device structure 10, in accordance with some embodiments. As shown in FIG. 5, the MRAM array 300 is disposed between the transistor structure 101 and the magnetic layer 230. Back side contacts 420 may be formed in the substrate 100. The back side contacts 420 may include the same material as the conductive features 412. The back side contacts 420 may be electrically connected to the transistors 406 in the active device region 402 and the MRAM array 300. Conductive features 422, 424 may be disposed in portion of the IMDs 125 in the active device region 402 and may be electrically connected to the back side contact 420 and the MRAM array 300. The conductive features 422, 424 may include the same material as the conductive feature 412. The conductive features 422, 424 and the magnetic features 210, 212 may include different materials and may be formed by the same process as the conductive features 412, 414 and the magnetic features 204, 206.

In some embodiments, which may be combined with other embodiments described herein, each magnetic structure 202 is connected to a corresponding magnetic structure 208 by a magnetic feature 430. Unlike the dummy transistor 408, which does not include a magnetic material, the magnetic feature 430 includes a magnetic material. In some embodiments, the magnetic feature 430 includes the same magnetic material as the magnetic structure 202. The magnetic feature 430 may extend through the dummy transistor 408. For example, the magnetic feature 430 may extend through the source 103 and the substrate 100. The magnetic feature 430 provides improved magnetic shielding of the MRAM arrays 200, 300 against external magnetic field.

In some embodiments, which may be combined with other embodiments described herein, the substrate 100 is replaced with a dielectric material. The back side contacts 420 and the portion of the magnetic feature 430 may be disposed in the dielectric material.

As shown in FIG. 5, both MRAM arrays 200, 300 are shielded by the magnetic layer 220, the magnetic structures 202, the magnetic feature 430, the magnetic structures 208, and the magnetic layer 230 on all sides against external magnetic field.

Figure 6:
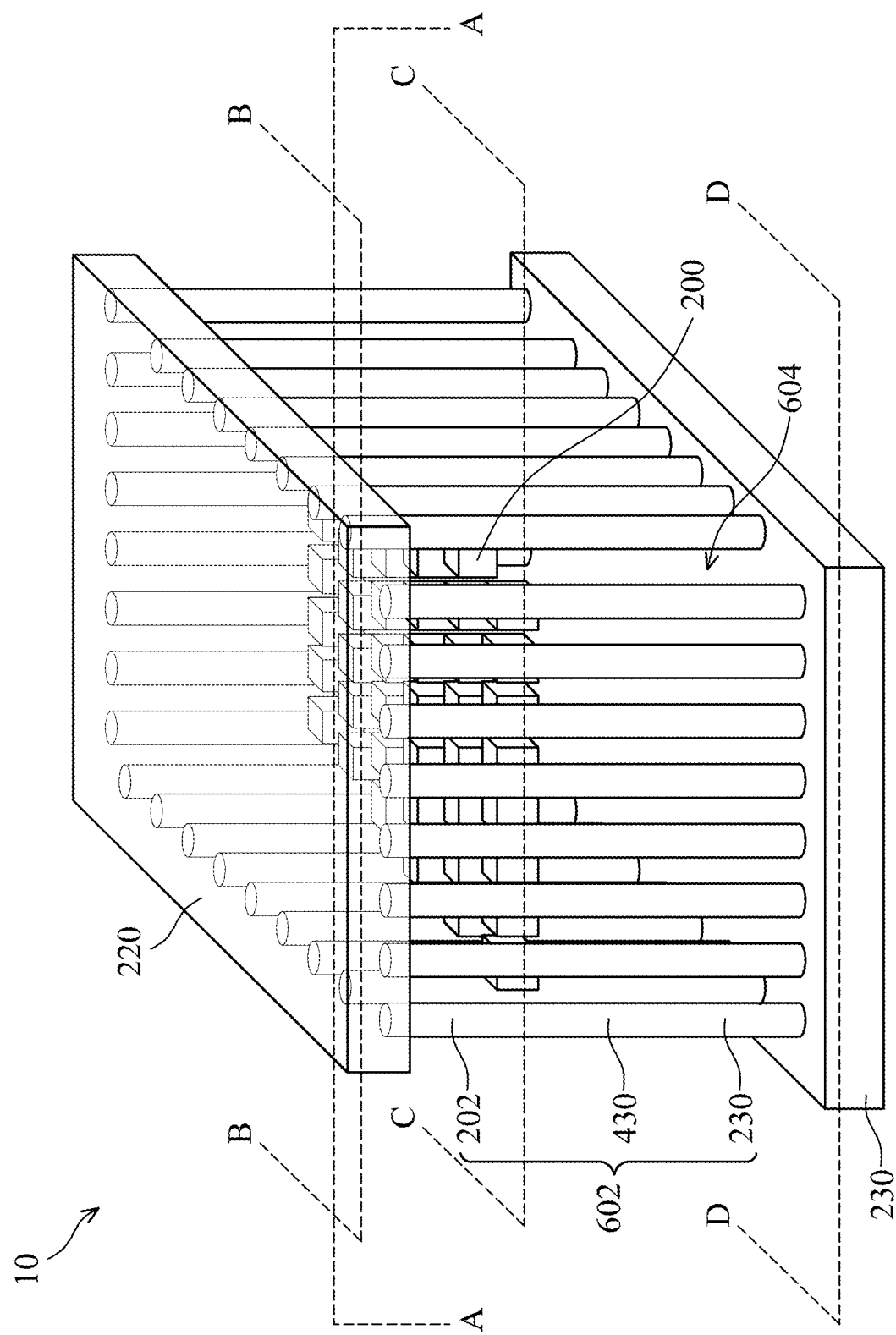
FIG. 6 is a perspective view of the magnetic device structure, in accordance with some embodiments.

FIG. 6 is a perspective view of the magnetic device structure 10, in accordance with some embodiments. The transistor structure 101, the IMDs 125, and the metal line layers are omitted for clarity. As shown in FIG. 6, the MRAM array 200 is disposed between the magnetic layers 220, 230 and surrounded by the plurality of magnetic structures 202, and the plurality of magnetic structures 208. Each magnetic structure 202 is aligned with a corresponding magnetic structure 208. In some embodiments, each magnetic structure 202 is connected to the corresponding magnetic structure 208 by the magnetic feature 430. For the sake of simplicity, each magnetic structure 202 and the corresponding magnetic structure 208 (and magnetic feature 430 in some embodiments) are shown in FIG. 6 as a column. Thus, each magnetic structure 202 and the corresponding magnetic structure 208 (and magnetic feature 430 in some embodiments) may form a magnetic column 602 extending from the magnetic layer 220 to the magnetic layer 230. The plurality of magnetic columns 602 are disposed spaced apart to surround the MRAM array 200. Gaps 604 are formed between adjacent magnetic columns 602. Because the magnetic layers 220, 230 are disposed over and below the MRAM array 200, electrical routing to and from the MRAM array 200 and the active device region 402 (FIG. 5) of the transistor structure 101 (FIG. 5) may be through the gaps 604. As described above, the MRAM array 300 may be disposed between the transistor structure 101 (FIG. 1) and the magnetic layer 230.

Figure 7:
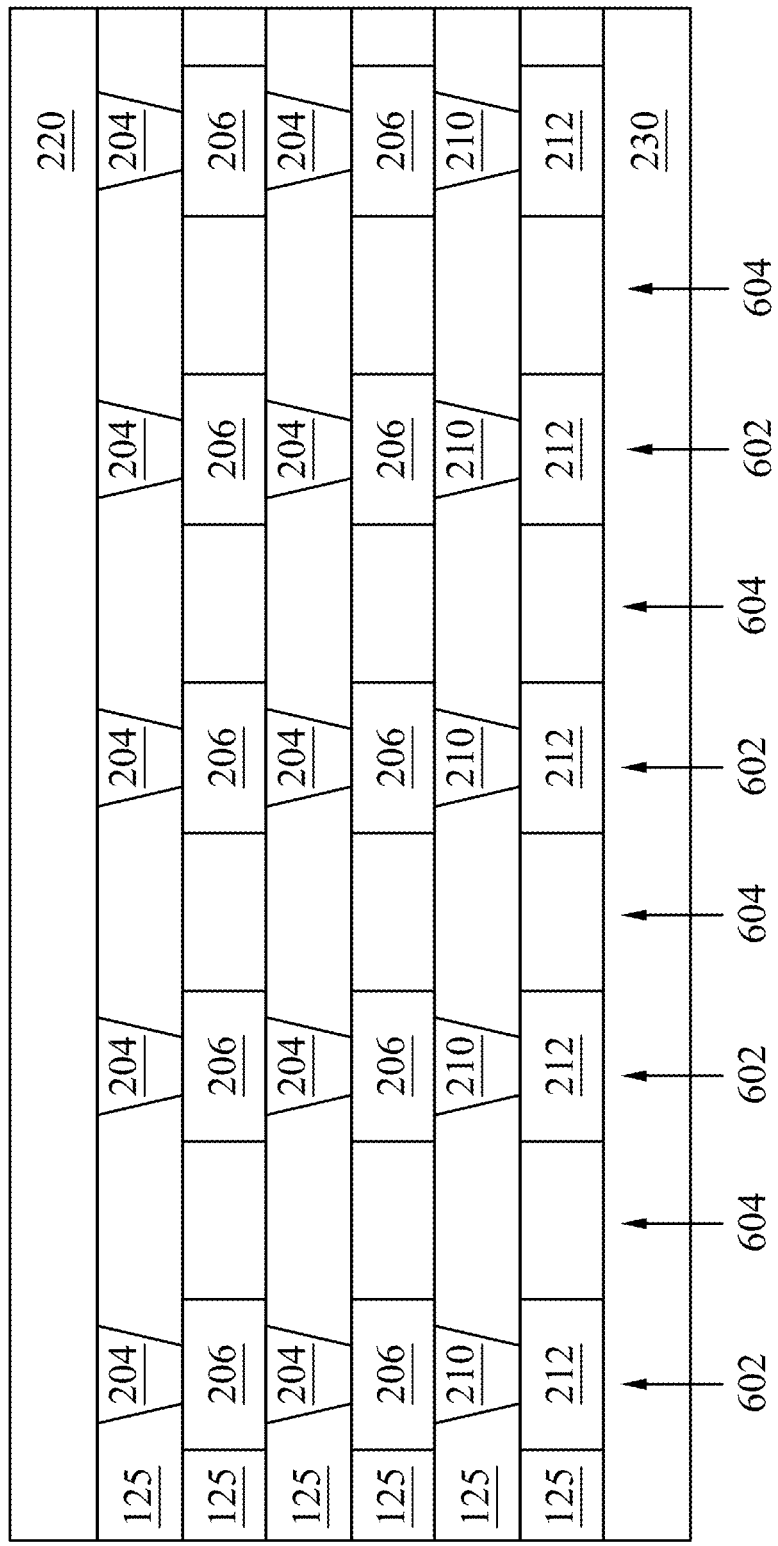
FIGS. 7 and 8 are cross-sectional side views of the magnetic device structure taken along cross-section A-A of FIG. 6, in accordance with some embodiments.

FIG. 7 is a cross-sectional side view of the magnetic device structure 10 taken along cross-section A-A of FIG. 6, in accordance with some embodiments. The transistor structure 101 (FIG. 5) is omitted for clarity. As shown in FIG. 7, the magnetic column 602 includes the plurality of magnetic features 204, 206, 210, 212, and gaps 604 are formed between adjacent magnetic columns 602. The gaps 604 may include the portion of the IMDs 125, and conductive features (not shown) may be disposed in and through the portion of the IMDs 125 in the gaps 604 in order to provide electrical routing for the MRAM array 200 and the transistors 406 (FIG. 5) disposed in the active device region 402 (FIG. 5) of the transistor structure 101 (FIG. 5).

Figure 8:
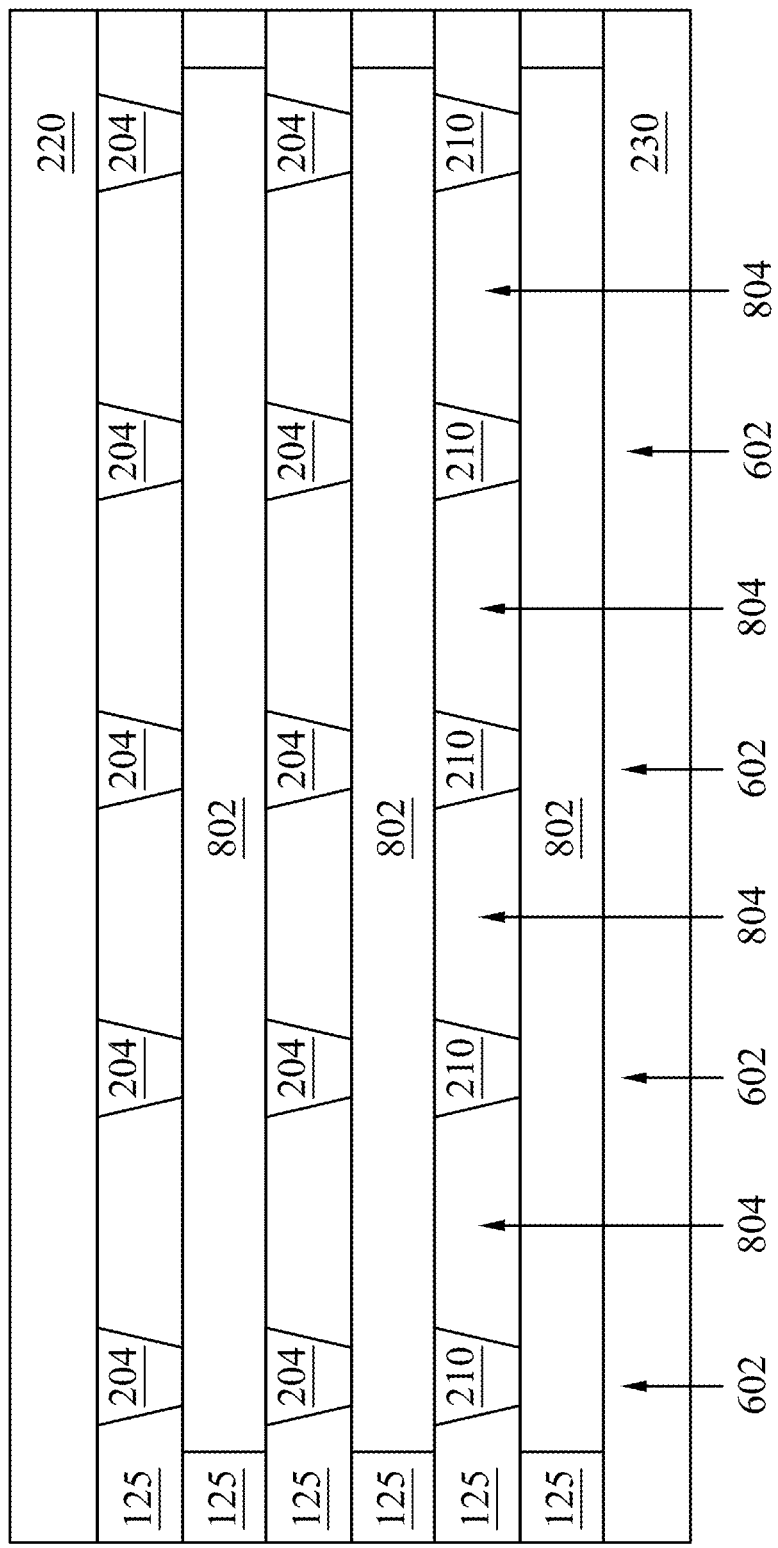

FIG. 8 is a cross-sectional side view of the magnetic device structure 10 taken along cross-section A-A of FIG. 6, in accordance with alternative embodiments. The transistor structure 101 (FIG. 5) is omitted for clarity. As shown in FIG. 8, the magnetic column 602 includes the plurality of magnetic features 204, 210, 802. The magnetic feature 802 may include the same material as the magnetic feature 204. The magnetic features 802 replaces the magnetic features 206, 212 and have larger dimensions than those of the magnetic features 206, 212. For example, the magnetic feature 802 extends across two or more magnetic columns 602, as shown in FIG. 8. The magnetic features 802 provides improved magnetic shielding of the MRAM arrays 200, 300 from the sides. Conductive features (not shown) may be disposed in and through the portion of the IMDs 125 in gaps 804 between adjacent magnetic features 210 or adjacent magnetic features 204 in order to provide electrical routing for the MRAM array 200 and the transistors 406 (FIG. 5) disposed in the active device region 402 (FIG. 5) of the transistor structure 101 (FIG. 5).

Figure 9:
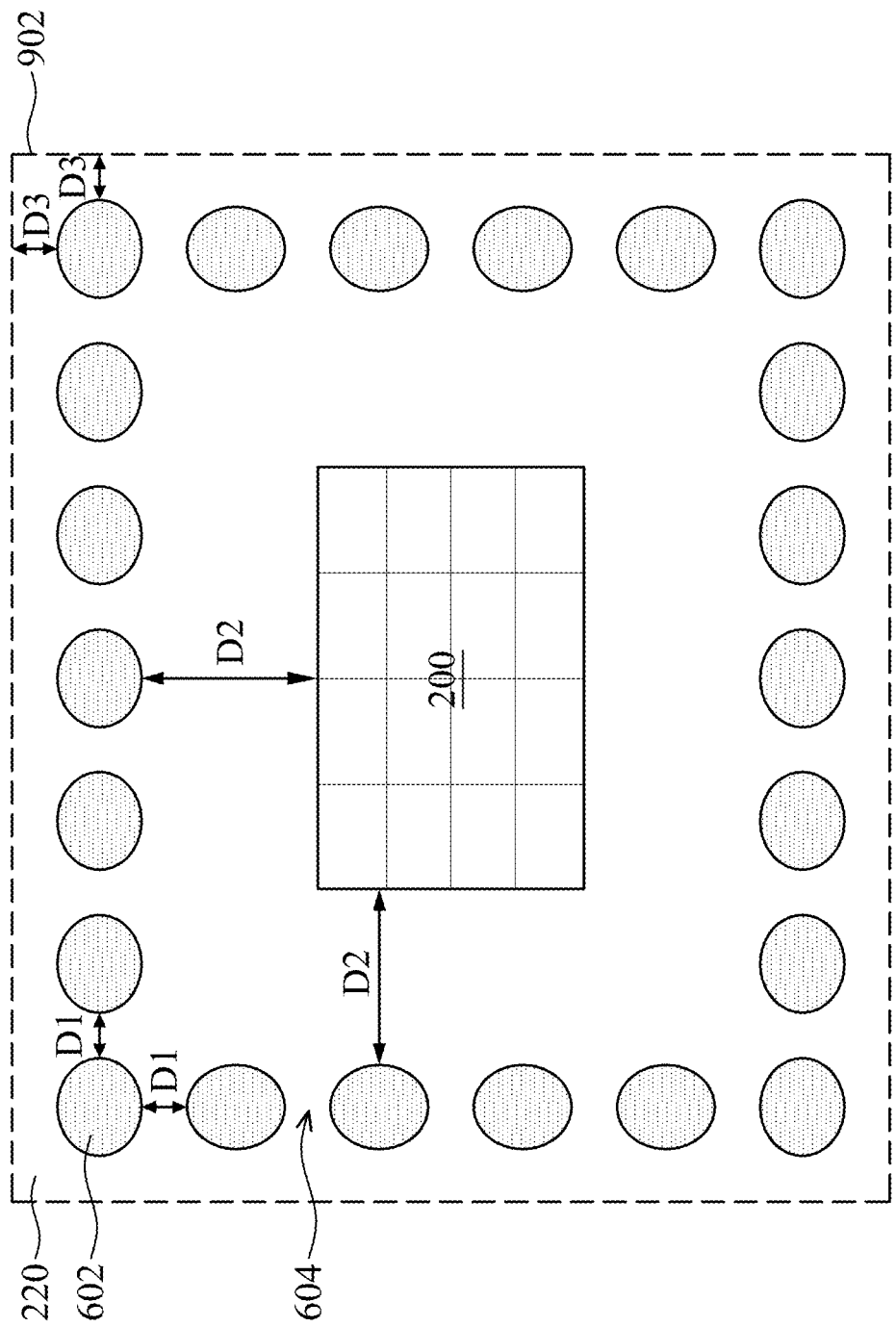
FIG. 9 is a cross-sectional top view of the magnetic device structure taken along cross-section C-C of FIG. 6, in accordance with some embodiments.

FIG. 9 is cross-sectional top view of the magnetic device structure 10 taken along cross-section C-C of FIG. 6, in accordance with some embodiments. The magnetic layer 220 disposed on the magnetic columns 602 and over the MRAM array 200 is shown in dotted lines. As shown in FIG. 9, the MRAM array 200 (and MRAM array 300 in some embodiments) is shielded by the magnetic layers 220, 230 (not shown) and the magnetic columns 602 against external magnetic field. The gaps 604 formed between adjacent magnetic columns 602 (or gaps 804 formed between adjacent magnetic features 204 or adjacent magnetic features 210) can provide space for electrical routing to and from the MRAM array 200 and the transistors 406 (FIG. 5) in the active device region 402 (FIG. 5) of the transistor structure 101 (FIG. 5). The electric routing may be achieved by a plurality of conductive features, such as the conductive features 412, 414 shown in FIG. 4. The gaps 604 are defined by a distance D1 between the adjacent magnetic columns 602. The distance D1 may be the shortest distance between the adjacent magnetic columns 602. The distance D1 ranges from about 30 nm to about 50 nm. If the distance D1 is less than about 30 nm, there may not be enough space for electrical routing to and from the MRAM array 200 and the transistors 406 (FIG. 5). On the other hand, if the distance D1 is greater than about 50 nm, the magnetic columns 602 may be insufficient to provide magnetic shielding of the MRAM array 200.

As shown in FIG. 9, the MRAM array 200 is a distance D2 away from the magnetic columns 602. The distance D2 may be the shortest distance between the magnetic columns 602 and the MRAM array 200. The distance D2 ranges from about 300 nm to about 500 nm. As described above, metal line layers may be disposed over or around the MRAM array 200 in the interconnect structure 101' (FIG. 4) in order to provide electrical routing. Thus, if the distance D2 is less than about 300 nm, there may not be enough space for the electrical routing. On the other hand, if the distance D2 is greater than about 500 nm, the dimensions of a die including the MRAM array 200 and the magnetic columns 602 may be unnecessarily large. As shown in FIG. 9, the magnetic layer 220 is disposed on the magnetic columns 602, and the magnetic columns 602 are a distance D3 away from the outer edge 902 of the magnetic layer 220. The distance D3 may be the shortest distance between the magnetic columns 602 and the outer edge 902 of the magnetic layer 220. The distance D3 ranges from about 30 nm to about 50 nm. If the distance D3 is less than about 30 nm, the processing tolerance for forming the magnetic layer 220 may be too small, resulting in the magnetic layer 220 not covering one or more magnetic columns 602. On the other hand, if the distance D3 is greater than about 50 nm, the dimensions of a die including the MRAM array 200, the magnetic columns 602, and the magnetic layer 220 may be unnecessarily large.

Figure 10A:
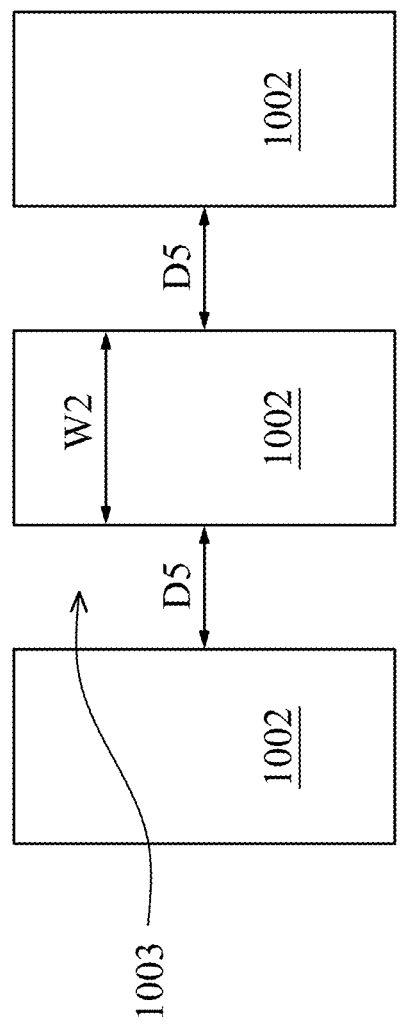
Figure 10B:
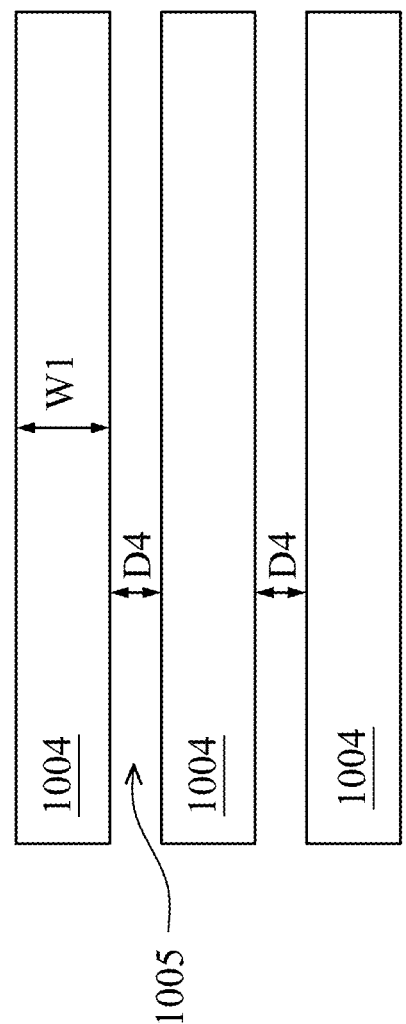

FIGS. 10A-10F are cross-sectional top views of the magnetic device structure 10, in accordance with alternative embodiments. As shown in FIGS. 10A and 10B, instead of having the magnetic layer 220 (FIG. 6), a plurality of magnetic lines 1002 and a plurality of magnetic lines 1004 are disposed over the MRAM array 200. The plurality of magnetic lines 1002 is disposed over the plurality of magnetic lines 1004, and magnetic features 204 (FIG. 2) may be disposed between the magnetic lines 1002 and the magnetic lines 1004. The magnetic line 1002 and the magnetic line 1004 may include the same material as the magnetic structure 202. The plurality of magnetic lines 1004 is disposed in a first IMD 125 (FIG. 4), and the magnetic lines 1004 are disposed spaced apart in the first IMD 125 by a distance D4. Gaps 1005 are formed between adjacent magnetic lines 1004 and defined by the distance D4. In some embodiments, electrical routing is provided through the gaps 1005. The distance D4 ranges from about 30 nm to about 200 nm. If the distance D4 is less than about 30 nm, there may not be enough space for electrical routing to and from the MRAM array 200 and the transistors 406 (FIG. 5). On the other hand, if the distance D4 is greater than about 200 nm, the magnetic lines 1004 may be insufficient to provide magnetic shielding of the MRAM array 200. Each magnetic line 1004 has a width W1 ranging from about 30 nm to about 130 nm. The magnetic line 1004 is disposed on and in contact with the magnetic feature 204 (FIG. 4). Thus, if the width W1 is less than about 30 nm, the magnetic line 1004 may not be wide enough to cover the magnetic feature 204. On the other hand, if the width W1 is greater than 130 nm, there may not be enough space between adjacent magnetic lines 1004 for electrical routing to and from the MRAM array 200 and the transistors 406 (FIG. 5). In some embodiments, the ratio of the distance D4 to the width W1 ranges from about 1 to about 2. If the ratio of the distance D4 to the width W1 is less than about 1, there may not be enough space between adjacent magnetic lines 1004 for electrical routing to and from the MRAM array 200 and the transistors 406 (FIG. 5). If the ratio of the distance D4 to the width W1 is greater than about 2, the magnetic lines 1004 may not be sufficient to provide magnetic shielding of the MRAM array 200.

As shown in FIG. 10A, the plurality of magnetic lines 1002 is disposed in a second IMD 125 (FIG. 4), which is disposed over the first IMD 125, and the plurality of magnetic lines 1002 are disposed spaced apart in the second IMD 125 by a distance D5. A third IMD 125 may be disposed between the plurality of magnetic lines 1002 and the plurality of magnetic lines 1004, and the magnetic features 204 (FIG. 4) may be disposed in the third IMD 125 to connect corresponding magnetic lines 1002, 1004. Gaps 1003 are formed between adjacent magnetic lines 1002 and defined by the distance D5. In some embodiments, electrical routing is provided through the gaps 1003. The distance D5 ranges from about 60 nm to about 200 nm. If the distance D5 is less than about 60 nm, there may not be enough space for electrical routing to and from the MRAM array 200 and the transistors 406 (FIG. 5). On the other hand, if the distance D5 is greater than about 200 nm, the magnetic lines 1002 may be insufficient to provide magnetic shielding of the MRAM array 200. Each magnetic line 1002 has a width W2 ranging from about 60 nm to about 130 nm. The width W2 may be substantially greater than the width W1 because the magnetic lines 1002 are disposed over the magnetic lines 1004. Features disposed higher in the interconnect structure 101' may have larger dimensions, which are easier to pattern. Thus, if the width W2 is less than about 60 nm, the patterning process for the magnetic lines 1002 may be unnecessarily complex. On the other hand, if the width W2 is greater than 130 nm, there may not be enough space between adjacent magnetic lines 1002 for electrical routing to and from the MRAM array 200 and the transistors 406 (FIG. 5). In some embodiments, the ratio of the distance D5 to the width W2 ranges from about 1 to about 2. If the ratio of the distance D5 to the width W2 is less than about 1, there may not be enough space between adjacent magnetic lines 1002 for electrical routing to and from the MRAM array 200 and the transistors 406 (FIG. 5). If the ratio of the distance D5 to the width W2 is greater than about 2, the magnetic lines 1002 may not be sufficient to provide magnetic shielding of the MRAM array 200.

As shown in FIGS. 10A and 10B, the plurality of magnetic lines 1002 is oriented in a first direction, and the plurality of magnetic lines 1004 is oriented in a second direction substantially perpendicular to the first direction. For example, the plurality of magnetic lines 1002 may be disposed vertically and may be horizontally spaced apart from each other. The plurality of magnetic lines 1004 may be disposed horizontally and may be vertically spaced apart from each other. The orientations of the plurality of magnetic lines 1002, 1004 may be switched. For example, the plurality of magnetic lines 1002 may be disposed horizontally and may be vertically spaced apart from each other. The plurality of magnetic lines 1004 may be disposed vertically and may be horizontally spaced apart from each other. The plurality of magnetic lines 1002 and the plurality of magnetic lines 1004 together form a magnetic structure having dimensions greater than those of the MRAM array 200 in the plane substantially parallel to a major surface of the substrate 100. The magnetic structure formed by the plurality of magnetic lines 1002, 1004 provide sufficient magnetic shielding of the MRAM array 200 against external magnetic field from the top.

Similarly, instead of having the magnetic layer 230 (FIG. 6), a plurality of magnetic lines 1006 and a plurality of magnetic lines 1008 are disposed below the MRAM array 200, as shown in FIGS. 10C and 10D. The plurality of magnetic lines 1006 may be disposed over the plurality of magnetic lines 1008. The magnetic line 1006 and the magnetic line 1008 may include the same material as the magnetic structure 202. The plurality of magnetic lines 1008 is disposed in a first IMD 125 in the back side interconnect structure 201 (FIG. 5), and the magnetic lines 1008 are disposed spaced apart in the first IMD 125 by a distance D6. Each magnetic line 1008 has a width W3 ranging from about 60 nm to about 130 nm. In some embodiments, the dimensions of the magnetic line 1008 are substantially the same as the dimensions of the magnetic line 1002. Gaps 1009 are formed between adjacent magnetic lines 1008 and defined by the distance D6. In some embodiments, the distance D6 is substantially the same as the distance D5. In some embodiments, the ratio of the distance D6 to the width W3 ranges from about 1 to about 2. If the ratio of the distance D6 to the width W3 is less than about 1, there may not be enough space between adjacent magnetic lines 1008 for electrical routing to and from the MRAM array 200 and the transistors 406 (FIG. 5). If the ratio of the distance D6 to the width W3 is greater than about 2, the magnetic lines 1008 may not be sufficient to provide magnetic shielding of the MRAM array 200.

The plurality of magnetic lines 1006 is disposed in a second IMD 125 in the back side interconnect structure 201 (FIG. 5), which is disposed over the first IMD 125, and the plurality of magnetic lines 1006 are disposed spaced apart in the second IMD 125 by a distance D7. A third IMD 125 may be disposed between the plurality of magnetic lines 1006 and the plurality of magnetic lines 1008, and the magnetic features 204 (FIG. 4) may be disposed in the third IMD 125 to connect corresponding magnetic lines 1006, 1008. Gaps 1007 are formed between adjacent magnetic lines 1006 and defined by the distance D7. In some embodiments, the distance D7 is substantially the same as the distance D4. Each magnetic line 1006 has a width W4 ranging from about 30 nm to about 130 nm. In some embodiments, the width W4 is substantially the same as the width W1. In some embodiments, the ratio of the distance D7 to the width W4 ranges from about 1 to about 2. If the ratio of the distance D7 to the width W4 is less than about 1, there may not be enough space between adjacent magnetic lines 1006 for electrical routing to and from the MRAM array 200 and the transistors 406 (FIG. 5). If the ratio of the distance D7 to the width W4 is greater than about 2, the magnetic lines 1006 may not be sufficient to provide magnetic shielding of the MRAM array 200.

The plurality of magnetic lines 1008 is oriented in a first direction, and the plurality of magnetic lines 1006 is oriented in a second direction substantially perpendicular to the first direction. For example, the plurality of magnetic lines 1008 may be disposed vertically and may be horizontally spaced apart from each other. The plurality of magnetic lines 1006 may be disposed horizontally and may be vertically spaced apart from each other. The orientations of the plurality of magnetic lines 1006, 1008 may be switched. For example, the plurality of magnetic lines 1008 may be disposed horizontally and may be vertically spaced apart from each other. The plurality of magnetic lines 1006 may be disposed vertically and may be horizontally spaced apart from each other. The plurality of magnetic lines 1006 and the plurality of magnetic lines 1008 together form a magnetic structure having dimensions greater than those of the MRAM array 200 in the plane substantially parallel to a major surface of the substrate 100. The magnetic structure formed by the plurality of magnetic lines 1006, 1008 provide sufficient magnetic shielding of the MRAM array 200 against external magnetic field from the bottom.

Figure 10E:
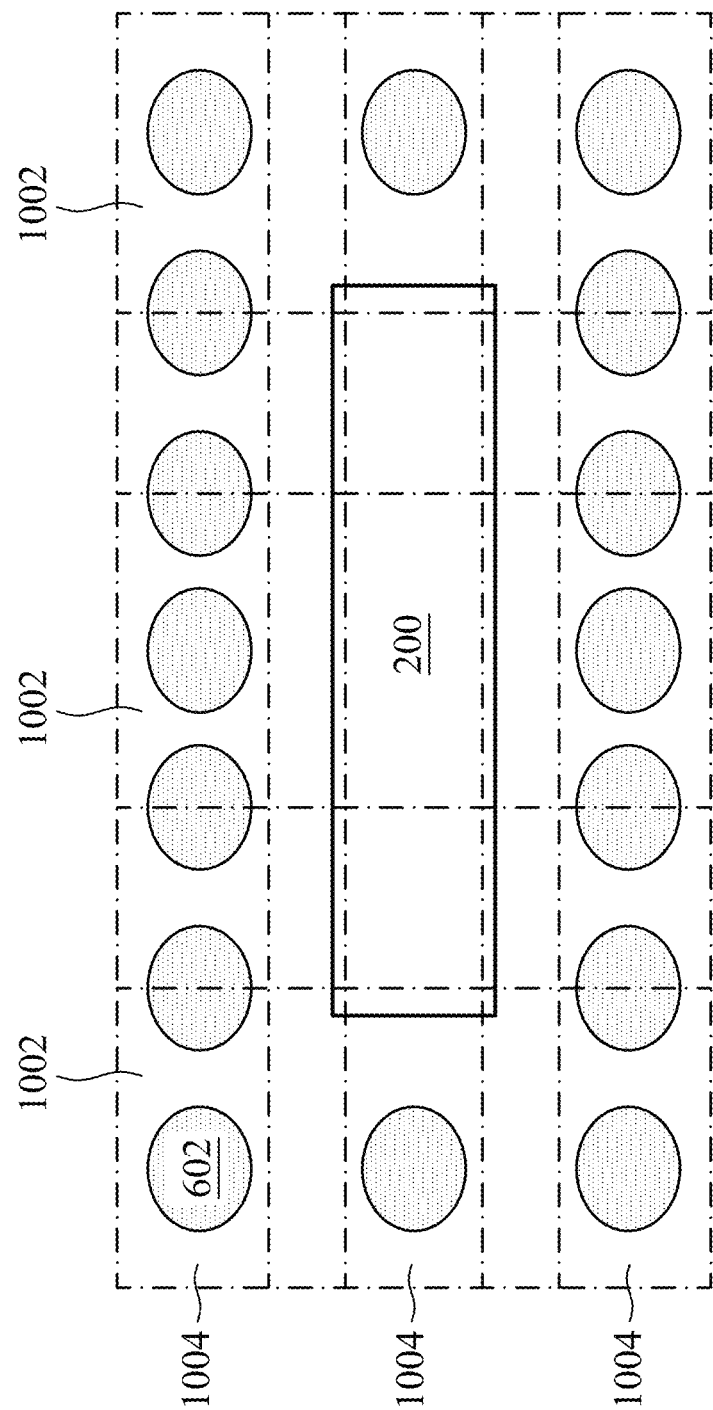
Figure 10F:
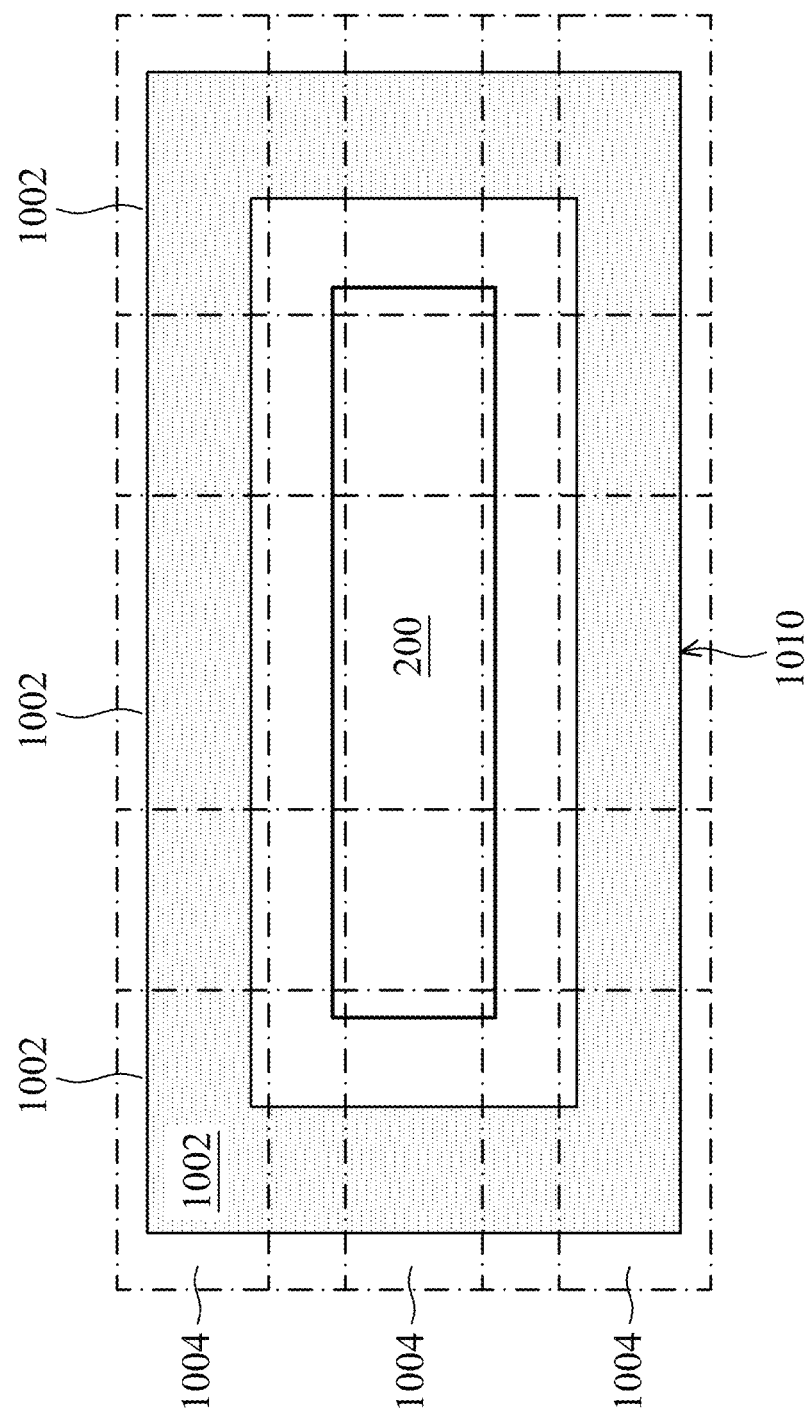

FIGS. 10E and 10F are cross-sectional top views of the magnetic device structure 10 taken along cross-section C-C of FIG. 6, in accordance with some embodiments. The magnetic lines 1002, 1004 disposed over the magnetic columns 602 and over the MRAM array 200 are shown in dotted lines. As shown in FIG. 10E, the MRAM array 200 (and MRAM array 300 in some embodiments) is shielded by the magnetic lines 1002, 1004, 1006 (not shown), 1008 (not shown), and the magnetic columns 602 against external magnetic field. As described above, magnetic features, such as the magnetic features 204 shown in FIG. 4, may be disposed between the magnetic lines 1002 and magnetic lines 1004. The magnetic features may be substantially aligned with the magnetic columns 602.

As shown in FIG. 10F, a magnetic structure 1010 surrounds the MRAM array 200 instead of the magnetic columns 602 (FIG. 10E). The magnetic structure 1010 may include the same magnetic material as the magnetic structure 202. The magnetic structure 1010 may include magnetic walls 1020. In some embodiments, four magnetic walls 1020 surrounds four sides of the MRAM array 200. Each magnetic wall 1020 extends from the plurality of magnetic lines 1004 to the plurality of magnetic lines 1006 (FIG. 10C). With the magnetic structure 1010 including the magnetic walls 1020, no gaps are formed around the sides of the MRAM array 200. Electrical routing to and from the MRAM array 200 and the transistors 406 (FIG. 5) of the transistor structure 101 (FIG. 5) in the active device region 402 (FIG. 5) may be through gaps 1003, 1005, 1007, 1009 (FIGS. 10A-10D).

Various embodiments or examples described herein offer multiple advantages over the state-of-art technology. According to some embodiments of the present disclosure, a MRAM array is shielded against external magnetic field from all sides by magnetic layers 220, 230 and magnetic columns 602. In some embodiments, a MRAM array is shielded against external magnetic field from all sides by plurality of magnetic lines 1002, 1004, 1006, 1008 and magnetic columns 602 or a magnetic structure 1010. With reduced or minimized external magnetic field reaching the MRAM array 200, device life is extended, and device failure is reduced or minimized.

An embodiment is a magnetic device structure. The structure includes one or more first transistors, a magnetic device disposed over the one or more first transistors, a plurality of magnetic columns surrounding sides of the one or more first transistors and the magnetic device, a first magnetic layer disposed over the magnetic device and in contact with the plurality of magnetic columns, and a second magnetic layer disposed below the one or more first transistors and in contact with the plurality of magnetic columns.

Another embodiment is a magnetic device structure. The structure includes one or more first transistors, a magnetic device disposed over the one or more first transistors, a plurality of magnetic columns surrounding sides of the one or more first transistors and the magnetic device, a first plurality of magnetic lines disposed over the magnetic device and in contact with the plurality of magnetic columns, a second plurality of magnetic lines disposed over the first plurality of magnetic lines, a third plurality of magnetic lines disposed below the one or more transistors and in contact with the plurality of magnetic columns, and a fourth plurality of magnetic lines disposed below the third plurality of magnetic lines.

A further embodiment is a magnetic device structure. The structure includes one or more first transistors, a magnetic device disposed over the one or more first transistors, a magnetic structure surrounding sides of the one or more first transistors and the magnetic device, a first plurality of magnetic lines disposed over the magnetic device and in contact with the magnetic structure, a second plurality of magnetic lines disposed over the first plurality of magnetic lines, a third plurality of magnetic lines disposed below the one or more transistors and in contact with the magnetic structure, and a fourth plurality of magnetic lines disposed below the third plurality of magnetic lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A magnetic device structure, comprising:
   a device structure;
   a first magnetic device disposed over the device structure;
   a first plurality of magnetic structures surrounding sides of the first magnetic device, wherein each magnetic structure of the first plurality of magnetic structures comprises alternately arranged magnetic vias and magnetic islands;
   a second magnetic device disposed below the device structure;
   a second plurality of magnetic structures surrounding sides of the second magnetic device;
   a first magnetic layer disposed over the first magnetic device and in contact with the first plurality of magnetic structures; and
   a second magnetic layer disposed below the second magnetic device and in contact with the second plurality of magnetic structures.

2. The magnetic device structure of claim 1, wherein the first magnetic device is a first magnetic random access memory (MRAM) array, and the second magnetic device is a second MRAM array.

3. The magnetic device structure of claim 1, wherein the magnetic vias and magnetic islands each comprises Co, Ni, Fe, or combinations thereof.

4. The magnetic device structure of claim 1, wherein a length of one of the first plurality of magnetic structures is greater than a length of one of the second plurality of magnetic structures.

5. The magnetic device structure of claim 1, wherein the device structure is a transistor structure.

6. The magnetic device structure of claim 1, further comprising:
   a first interconnect structure disposed over the device structure, wherein the first plurality of magnetic structures is disposed in the first interconnect structure; and a second interconnect structure disposed below the device structure, wherein the second plurality of magnetic structures is disposed in the second interconnect structure.

7. The magnetic device structure of claim 1, wherein each of the first plurality of magnetic structures is aligned with a corresponding magnetic structure of the second plurality of magnetic structures.

8. A magnetic device structure, comprising:
   one or more first transistors;
   a magnetic device disposed over the one or more first transistors;
   a plurality of magnetic columns surrounding sides of the one or more first transistors and the magnetic device;
   a first plurality of magnetic lines disposed over the magnetic device and in contact with the plurality of magnetic columns, wherein magnetic lines of the first plurality of magnetic lines are oriented in a first direction; and
   a second plurality of magnetic lines disposed over the first plurality of magnetic lines, wherein magnetic lines of the second plurality of magnetic lines are oriented in a second direction perpendicular to the first direction.

9. The magnetic device structure of claim 8, wherein each of the first plurality of magnetic lines has a first width, and each of the second plurality of magnetic lines has a second width greater than the first width.

10. The magnetic device structure of claim 9, wherein magnetic lines of the first plurality of magnetic lines are spaced apart by a first distance, and magnetic lines of the second plurality of magnetic lines are spaced apart by a second distance.

11. The magnetic device structure of claim 10, wherein the second distance is greater than the first distance.

12. The magnetic device structure of claim 10, wherein a ratio of the first distance to the first width ranges from about 1 to about 2.

13. The magnetic device structure of claim 12, wherein a ratio of the second distance to the second width ranges from about 1 to about 2.

14. The magnetic device structure of claim 10, wherein the first distance ranges from about 30 nm to about 200 nm, and the second distance ranges from about 60 nm to about 200 nm.

15. The magnetic device structure of claim 8, wherein the plurality of magnetic columns comprises a magnetic feature extending across two or more magnetic columns of the plurality of magnetic columns.

16. The magnetic device structure of claim 8, wherein the magnetic device is a magnetic random access memory (MRAM) array.

17. A magnetic device structure, comprising:
   a device structure;
   a magnetic device disposed over the device structure;
   a magnetic structure surrounding sides of the magnetic device, wherein the magnetic structure comprises four magnetic walls;
   a first plurality of magnetic lines disposed over the magnetic device and in contact with the magnetic structure, wherein the magnetic structure extends from the device structure to the first plurality of magnetic lines; and
   a second plurality of magnetic lines disposed over the first plurality of magnetic lines.

18. The magnetic device structure of claim 17, further comprising a third plurality of magnetic lines disposed below the magnetic device and in contact with the magnetic structure and a fourth plurality of magnetic lines disposed below the third plurality of magnetic lines.

19. The magnetic device structure of claim 18, wherein the first, second, third, fourth pluralities of magnetic lines and the four magnetic walls each comprises a magnetic material.

20. The magnetic device structure of claim 19, wherein the magnetic material comprises Co, Ni, Fe, or combinations thereof.

* * * * *